(12) United States Patent
Nomura et al.

(10) Patent No.: US 7,927,967 B2
(45) Date of Patent: Apr. 19, 2011

(54) METHOD FOR MANUFACTURING SEMICONDUCTOR MEMORY DEVICE

(75) Inventors: Kayo Nomura, Kanagawa-ken (JP); Hideto Matsuyama, Harrison, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/608,903

(22) Filed: Oct. 29, 2009

(65) Prior Publication Data
US 2010/0144133 A1     Jun. 10, 2010

(30) Foreign Application Priority Data

Dec. 8, 2008   (JP) ................................ 2008-312067

(51) Int. Cl.
*H01L 21/76*     (2006.01)
(52) U.S. Cl. ........ 438/430; 438/128; 438/288; 438/435; 257/E21.54; 257/E21.585; 257/E21.679
(58) Field of Classification Search ............... 438/195, 438/196, 288, 353, 355, 359, 361, 403, 587, 438/590; 257/E21.305, E21.457, E21.483, 257/E21.613
See application file for complete search history.

(56) References Cited

U.S. PATENT DOCUMENTS

| 2007/0158736 | A1 | 7/2007 | Arai et al. | |
| 2010/0207185 | A1* | 8/2010 | Lee et al. | 257/314 |

FOREIGN PATENT DOCUMENTS

JP     2008-171918     7/2008

OTHER PUBLICATIONS

Kim, J. et al., Novel 3-D Structure for Ultra High Density Flash Memory with VRAT (Vertical-Recess-Array-Transistor) and PIPE ( Planarized Integration on the same PlanE), 2008 Symposium on VLSI Technology Digest of Technical Papers, pp. 122-123, (2008).

* cited by examiner

*Primary Examiner* — Cheung Lee
(74) *Attorney, Agent, or Firm* — Finnegan, Henderson, Farabow, Garrett & Dunner, L.L.P.

(57) ABSTRACT

A method for manufacturing a semiconductor memory device, includes: forming a stacked unit above a semiconductor substrate; making a hole in the stacked unit to pass through electrode layers and insulating layers of the stacked unit; forming an insulating film on a side wall of the hole, the insulating film including a charge storage layer; forming a semiconductor layer in an interior of the hole to align in a stacking direction of the electrode layers and the insulating layers to form a memory string; making a trench in a portion of the stacked unit proximal to the memory string to pass through the electrode layers and the insulating layers; forming a metal film on a side wall of the trench; forming a cap film to cover the metal film and fill into the trench; performing heat treatment to form a compound on the side wall of the trench.

20 Claims, 11 Drawing Sheets

METHOD FOR MANUFACTURING SEMICONDUCTOR MEMORY DEVICE

CROSS-REFERENCE TO RELATED APPLICATIONS

This application is based upon and claims the benefit of priority from the prior Japanese Patent Application No. 2008-312067, filed on Dec. 8, 2008; the entire contents of which are incorporated herein by reference.

BACKGROUND OF THE INVENTION

1. Field of the Invention

The invention relates to a method for manufacturing a semiconductor memory device.

2. Background Art

Conventional stacked memory technology forms normal planar memory cells on a silicon substrate, repeats the forming step for each layer, and therefore is not suited to large-capacity memory because many manufacturing steps are performed for each layer. Therefore, technology is proposed to realize large-capacity memory with high manufacturing efficiency by collectively making holes to pass from the uppermost layer to the lowermost layer of a stacked structure including alternately stacked word line electrode layers and inter-layer dielectric layers and filling columnar silicon into the holes as channels (for example, JP-A 2008-171918 (Kokai)). Such technology has a structure in which the columnar silicon covers the word line electrode layers at a constant spacing to form a memory cell transistor by providing a charge storage layer for retaining data at the intersection between each word line electrode layer and the silicon column.

JP-A 2008-171918 (Kokai) discloses technology performing metal siliciding of electrode layers adjacent to a trench to realize reduced resistance by making the trench adjacent to a silicon column, exposing the electrode layers (silicon layers) inside the trench, forming a metal film on the side wall of the trench, and subsequently performing annealing.

In such a case, there is a risk that shorts may occur between the electrode layers when the metal silicide comes into contact between the electrode layers above and below due to volume expansion of the metal silicide during annealing.

SUMMARY OF THE INVENTION

According to an aspect of the invention, there is provided a method for manufacturing a semiconductor memory device, including: forming a stacked unit above a semiconductor substrate, the stacked unit including a plurality of insulating layers alternately stacked with a plurality of electrode layers, the electrode layers being formed of a semiconductor; making a hole in the stacked unit to pass through the electrode layers and the insulating layers; forming an insulating film on a side wall of the hole, the insulating film including a charge storage layer; forming a semiconductor layer in an interior of the hole to align in a stacking direction of the electrode layers and the insulating layers to form a memory string by multiply connecting memory cells in the stacking direction, the memory cell including the electrode layer, the charge storage layer opposing the electrode layer, and the semiconductor layer opposing the charge storage layer; making a trench in a portion of the stacked unit proximal to the memory string to pass through the electrode layers and the insulating layers; forming a metal film on a side wall of the trench; forming a cap film to cover the metal film and fill into the trench; performing heat treatment in the state where the cap film is filled into the trench to cause the metal film to react with the semiconductor of the electrode layers and form a compound between the semiconductor and the metal film at portions of the electrode layers contacting the metal film; removing the cap film and an unreacted excess portion of the metal film; and providing a dielectric substance in the trench after the cap film and the unreacted excess portion are removed.

DETAILED DESCRIPTION OF THE INVENTION

Embodiments of the invention will be described with reference to the drawings. Although silicon is used as an example of a semiconductor in this embodiment, semiconductors other than silicon may be used.

The semiconductor memory device according to this embodiment includes a memory cell array of three dimensionally arranged multiple memory cells and a peripheral circuit formed peripherally to the memory cell array.

Figure 1:
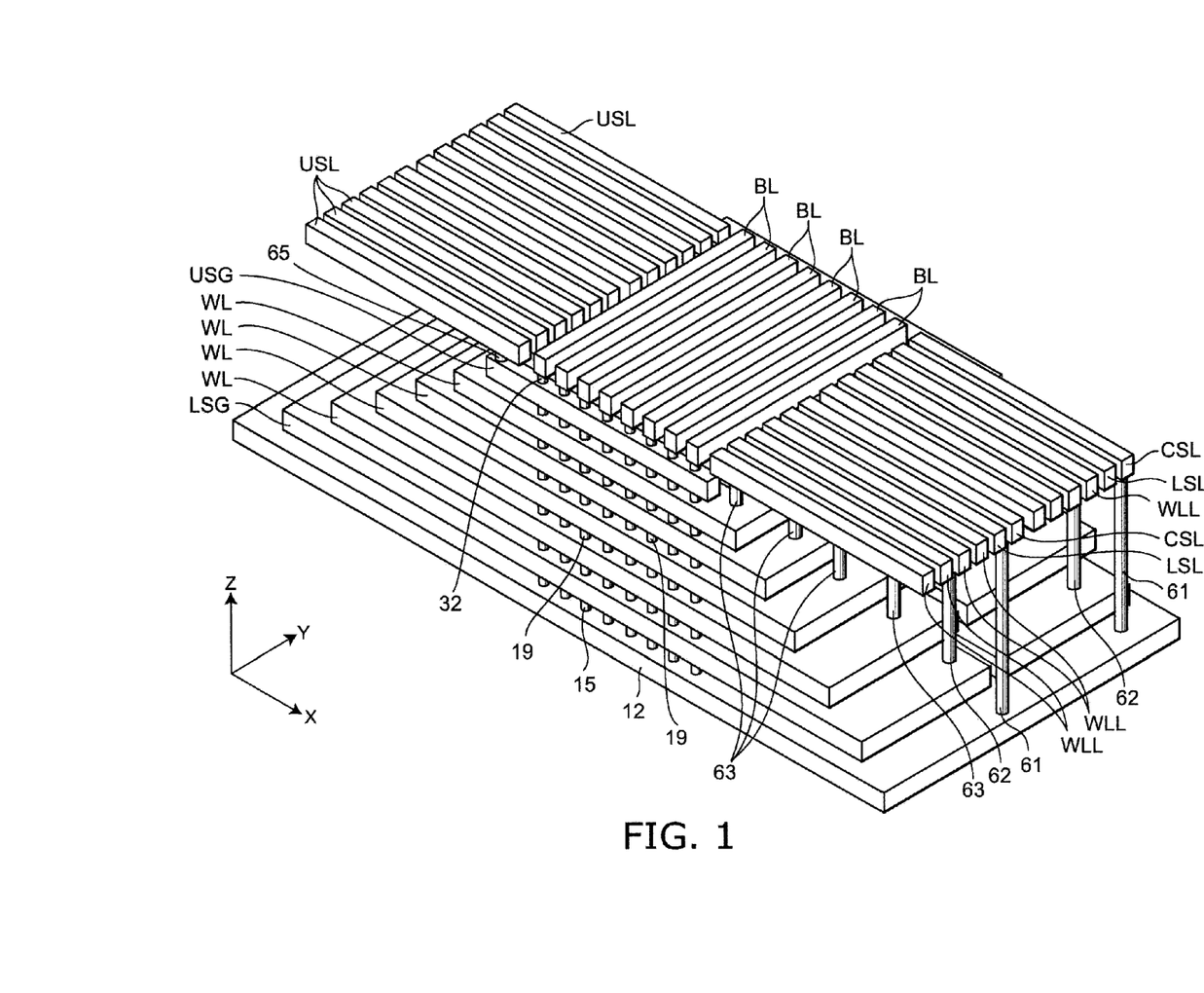
FIG. 1 is a schematic perspective view illustrating the configuration of the memory cell array of the semiconductor memory device according to an embodiment.

FIG. 1 is a schematic perspective view illustrating the configuration of the memory cell array of the semiconductor memory device according to this embodiment.

Figure 2:
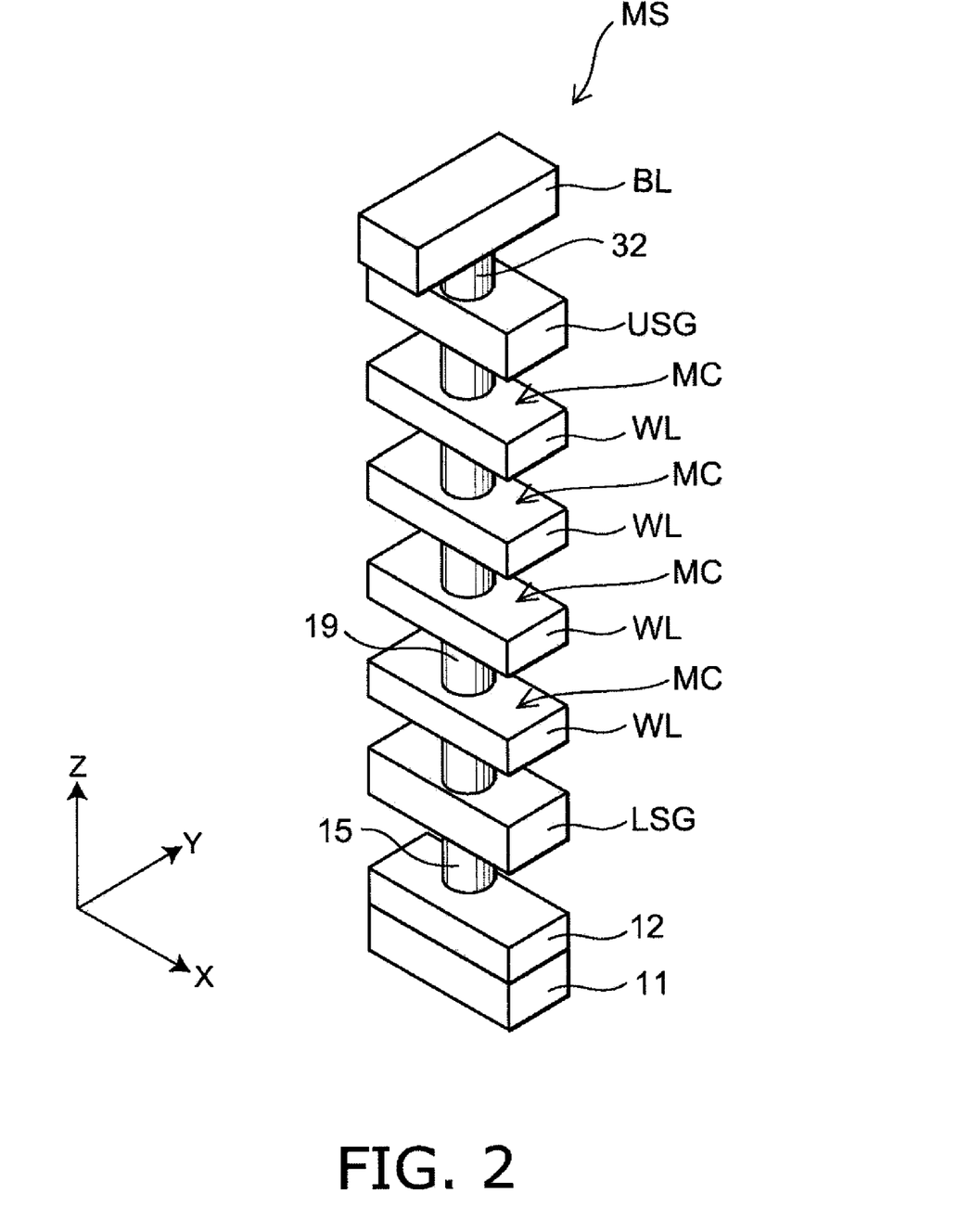
FIG. 2 is a schematic perspective view of one memory string of the memory cell array.

FIG. 2 is a schematic perspective view of one memory string (one series) formed of multiple memory cells connected in series in the stacking direction of the electrode layers.

Figure 3:
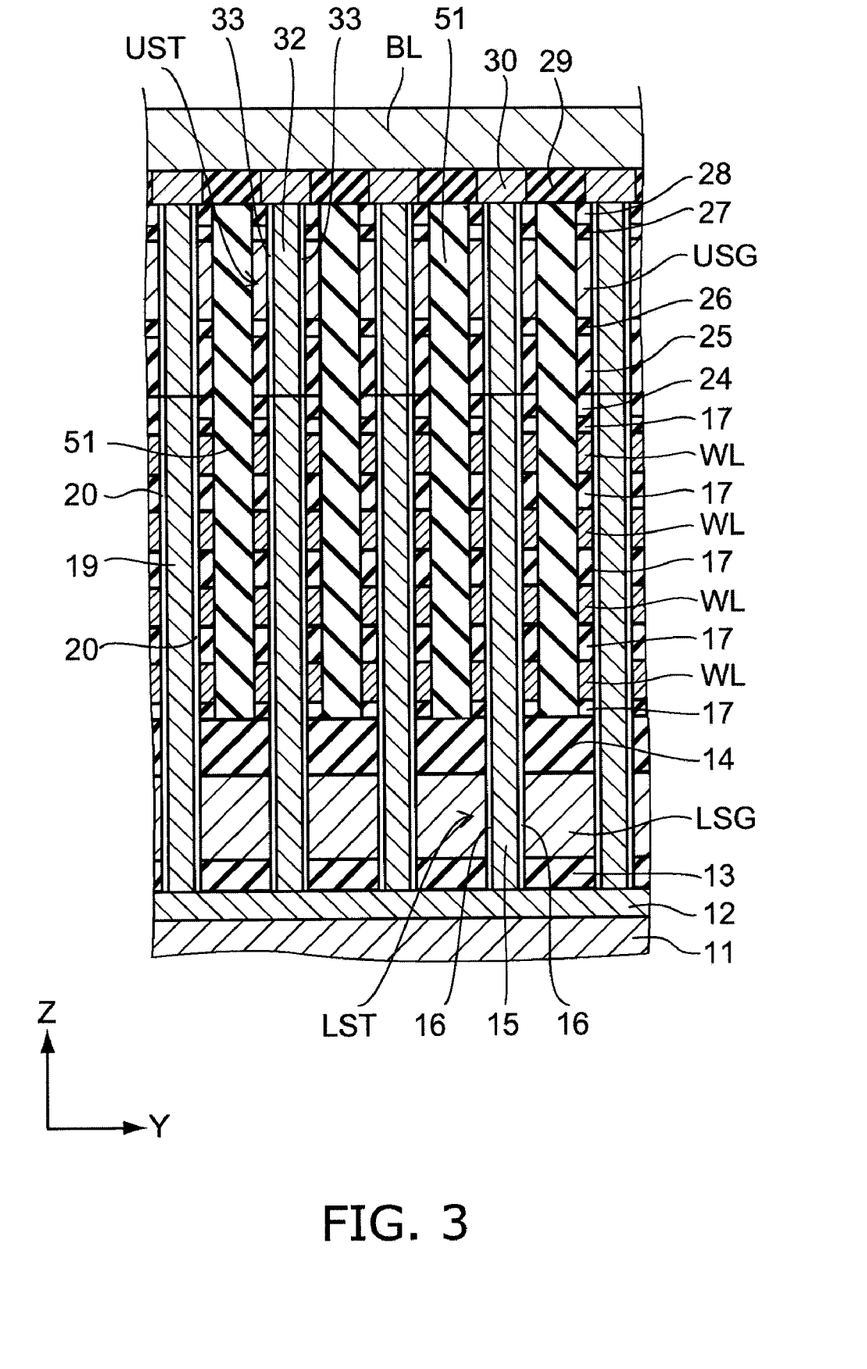
FIG. 3 is a schematic cross-sectional view of main components in the YZ direction of FIG. 1.

FIG. 3 is a schematic cross-sectional view of main components in the YZ direction of FIG. 1.

For better clarity of the drawings, FIG. 1 and FIG. 2 illustrate only the conductive portions, and the insulative portions are omitted.

An XYZ orthogonal coordinate system is introduced for convenience of description in the specification. In this coordinate system, two mutually orthogonal directions parallel to an upper face (major surface) of a silicon substrate are taken as an X direction and a Y direction. A direction orthogonal to both the X direction and the Y direction, that is, the stacking direction of electrode layers WL, is taken as a Z direction.

As illustrated in FIG. 3, a cell source 12 is provided on a silicon substrate 11. The cell source 12 is, for example, a silicon layer. A lower selection gate LSG is provided on the cell source 12 via an insulating layer 13. An insulating layer 14 is provided on the lower selection gate LSG. The insulating layers 13 and 14 are made of, for example, silicon oxide or silicon nitride. The lower selection gate LSG is, for example, a silicon layer.

A stacked unit is provided on the insulating layer 14. The stacked unit includes multiple insulating layers 17 made of, for example, silicon oxide alternately stacked with multiple electrode layers WL made of, for example, amorphous or polycrystalline silicon. Although the number of electrode layers WL is arbitrary, four layers are illustrated as an example in this embodiment.

An upper selection gate USG is provided on the uppermost insulating layer 17 via insulating layers 24, 25, and 26. Insulating layers 27 and 28 are provided on the upper selection gate USG. The insulating layers 24 to 28 are made of, for example, silicon oxide or silicon nitride. The upper selection gate USG is, for example, a silicon layer.

As illustrated in FIG. 1, the electrode layers WL, the lower selection gate LSG, and the cell source 12 are formed in plate configurations parallel to the XY plane. The upper selection gate USG is formed by multiply dividing a conductive layer (e.g., a silicon layer) having a plate configuration along the Y direction to form multiple conductive members having lead configurations aligned in the X direction. The lower selection gate LSG may have a multiply divided configuration similar to that of the upper selection gate USG.

Multiple through-holes are made in the stacked unit on the silicon substrate 11 described above to align in the Z direction. The multiple through-holes are arranged, for example, in a matrix configuration along the X direction and the Y direction.

Silicon pillars 15, 19, and 32 are filled into the interior of each of the through-holes as columnar semiconductor layers in this order from the lower layer side. The silicon pillar 15 passes through the lower selection gate LSG. The silicon pillar 19 passes through the multiple electrode layers WL. The silicon pillar 32 passes through the upper selection gate USG. The silicon pillars 15, 19, and 32 are formed of polycrystalline silicon or amorphous silicon. The silicon pillars 15, 19, and 32 have columnar configurations aligned in the Z direction and have, for example, circular columnar configurations. The lower end of the silicon pillar 15 connects to the cell source 12. The lower end of the silicon pillar 19 connects to the silicon pillar 15. The upper end of the silicon pillar 19 connects to the silicon pillar 32.

An insulating layer 29 (referring to FIG. 3) is provided on the insulating layer 28 on the upper selection gate USG. Multiple bit lines BL are provided on the insulating layer 29 to align in the Y direction. The bit lines BL are formed of, for example, a metal material (including pure metal and alloys).

Each of the bit lines BL is arranged to pass through a region directly above each series of the silicon pillars 32 arranged along the Y direction. Each of the bit lines BL is connected to the upper ends of the silicon pillars 32 via conductive connection portions 30 formed in the insulating layer 29.

As illustrated in FIG. 1, the upper selection gate USG is connected to an upper selection gate lead USL via a conductive connection portion 65. The end portions of the cell source 12, the lower selection gate LSG, and the stacked unit in which the multiple electrode layers WL are stacked are patterned into a stairstep configuration. At the stairstep configuration portion, the cell source 12 is connected to a cell source lead CSL via a conductive connection portion 61; the lower selection gate LSG is connected to a lower selection gate lead LSL via a conductive connection portion 62; and each of the electrode layers WL is connected to a word line WLL via a conductive connection portion 63.

Figure 4:
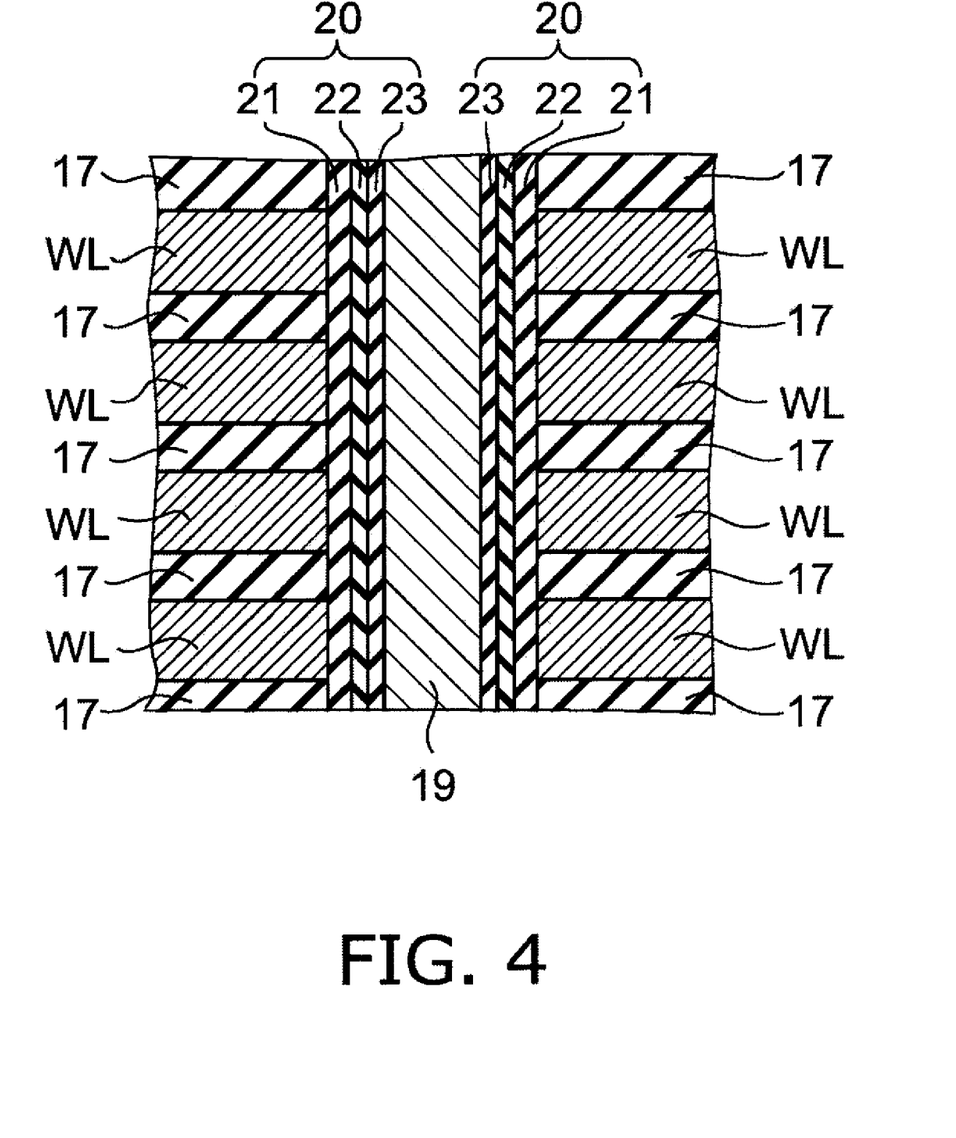
FIG. 4 is a schematic enlarged cross sectional view of a portion of FIG. 3.

As illustrated in FIG. 3, an insulating film 20 is formed on the inner circumferential wall of each of the through-holes made in the electrode layers WL and the insulating layers 17 of the stacked unit. The insulating film 20 has, for example, an ONO (Oxide-Nitride-Oxide) structure in which a silicon nitride film is disposed between silicon oxide films. FIG. 4 illustrates an enlarged cross section of a portion thereof.

The insulating film 20 has a structure in which a charge storage layer 22 is disposed between a first insulating film 21 and a second insulating film 23. The silicon pillar 19 is filled along the inner side of the second insulating film 23, and the second insulating film 23 contacts the silicon pillar 19. The first insulating film 21 is provided to contact the electrode layers WL. The charge storage layer 22 is provided between the first insulating film 21 and the second insulating film 23.

The silicon pillar 19 provided in the electrode layers WL and the insulating layers 17 of the stacked unit functions as a channel. The electrode layers WL function as control gates.

The charge storage layer 22 functions as a data memory layer to store charge injected by the silicon pillar 19. In other words, a memory cell having a structure of a gate electrode enclosing a channel is formed at the intersection of the silicon pillar 19 and each of the electrode layers WL.

The memory cell has a charge trap structure. The charge storage layer 22 has many traps that trap charge (electrons) and is made of, for example, a silicon nitride film. The second insulating film 23 is made of, for example, a silicon oxide film and acts as a potential barrier when the charge is injected by the silicon pillar 19 into the charge storage layer 22 or when the charge stored in the charge storage layer 22 diffuses into the silicon pillar 19. The first insulating film 21 is made of, for example, a silicon oxide film and prevents the charge stored in the charge storage layer 22 from diffusing into the electrode layers WL which function as gate electrodes.

As downscaling advances for the memory cell having the structure described above, normal writing/reading operations can be performed even without using diffusion layers forming source/drain regions. Accordingly, in this embodiment, the memory cell does not include diffusion layers having different conductivity types as source/drain regions in the silicon pillar 19. In other words, the silicon pillar 19 functions as the channel region, the source region, and the drain region of the memory cell. By controlling the voltage applied to each of the electrode layers WL, an OFF state can be realized by substantial depletion of the silicon pillar 19 opposing each of the electrode layers WL.

As illustrated in FIG. 2, the same number of memory cells MC as electrode layers WL are connected in series in the Z direction around one silicon pillar 19 to form one memory string MS. By arranging such a memory string MS in a matrix configuration in the X direction and the Y direction, multiple memory cells MC are arranged three dimensionally in the X direction, the Y direction, and the Z direction.

Once again referring to FIG. 3, a gate insulating film 16 is formed in a cylindrical configuration on the inner circumferential wall of the through-hole made in a stacked unit formed of the lower selection gate LSG and the insulating layers 13 and 14 therebelow and thereabove. The silicon pillar 15 is filled along the inner side of the gate insulating film 16. Thereby, the silicon pillar 15 in this stacked unit is provided as a channel, and a lower selection transistor LST is provided around the channel with the lower selection gate LSG as a gate electrode.

A gate insulating film 33 is formed in a cylindrical configuration on the inner circumferential wall of the through-hole made in a stacked unit formed of the upper selection gate USG and the insulating layers 25 to 28 therebelow and thereabove. The silicon pillar 32 is filled along the inner side of the gate insulating film 33. Thereby, the silicon pillar 32 in this stacked unit is provided as a channel, and an upper selection transistor UST is provided around the channel with the upper selection gate USG as a gate electrode.

As described below, a trench aligned along the X direction is made in the stacked units including the upper selection gate USG and each of the electrode layers WL. A dielectric substance (e.g., silicon oxide, silicon nitride, etc.) 51 is filled into the trench. In the example illustrated in FIG. 3, the trench and the dielectric substance 51 are provided between memory strings adjacent to each other in the Y direction. Although the upper selection gate USG and each of the electrode layers WL are layers including silicon, portions thereof adjacent to the dielectric substance 51 have reduced resistance by metal siliciding by a process described below.

A peripheral circuit is formed on the same silicon substrate 11 peripherally to the memory cell array described above. The peripheral circuit includes a driver circuit that applies a potential to the upper end portion of the silicon pillar 32 via the bit line BL; a driver circuit that applies a potential to the lower end portion of the silicon pillar 15 via the cell source lead CSL and the cell source 12; a driver circuit that applies a potential to the upper selection gate USG via the upper selection gate lead USL; a driver circuit that applies a potential to the lower selection gate LSG via the lower selection gate lead LSL; and a driver circuit that applies a potential to each of the electrode layers WL via the word line WLL.

The semiconductor memory device according to this embodiment is a nonvolatile semiconductor memory device capable of freely performing the electrical erasing/writing of data and retaining the stored content even when the power source is OFF.

The X coordinate of the memory cell is selected by selecting the bit line BL; the Y coordinate of the memory cell is selected by selecting the upper selection gate USG to switch the upper selection transistor UST to a conducting state or a nonconducting state; and the Z coordinate of the memory cell is selected by selecting the word line WLL, i.e., the electrode layer WL. Information is stored by injecting electrons into the charge storage layer 22 of the selected memory cell. The data stored in the memory cell is read by providing a sense current to the silicon pillar 19 passing through the memory cell.

The method for manufacturing the semiconductor memory device according to this embodiment will be described with reference to FIG. 5A to FIG. 9.

Figure 5A:
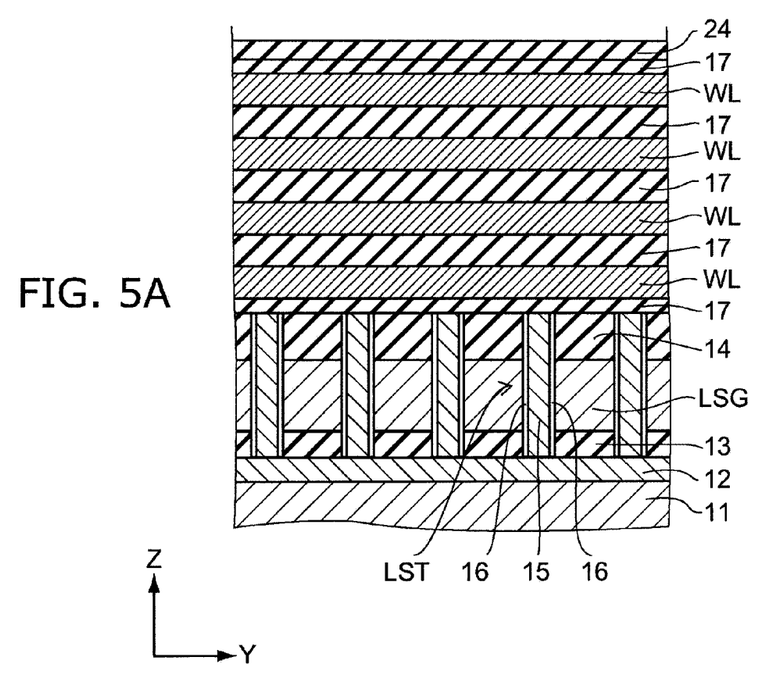
FIGS. 5A and 5B are schematic views of a manufacturing method of the semiconductor memory device according to the embodiment.

First, referring to FIG. 5A, the cell source 12 is formed on the silicon substrate 11. Then, a silicon layer is formed on the cell source 12 via the insulating layer 13 to form the lower selection gate LSG. The insulating layer 14 is formed thereupon. Through-holes are made by RIE (Reactive Ion Etching) in the stacked unit thus obtained to align in the Z direction and reach the cell source 12. Subsequently, the gate insulating film 16 is formed on the side walls of the through-holes, and thereafter, the silicon pillars 15 are filled. Thereby, the lower selection transistors LST are formed.

Then, multiple insulating layers (e.g., silicon oxide layers) 17 are alternately stacked with multiple electrode layers (e.g., amorphous or polycrystalline silicon layers) WL on the insulating layers (e.g., silicon nitride layers) 14. The insulating layer (e.g., a silicon nitride layer) 24 is formed on the uppermost insulating layer 17.

Figure 5B:
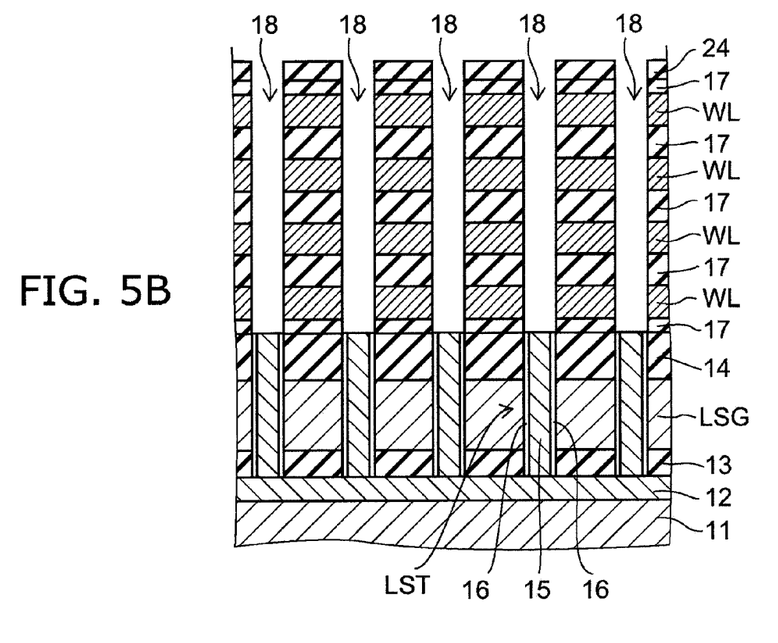

Continuing, the through-holes 18 are made by RIE to pass through the stacked units and align in the Z direction (FIG. 5B). The through-holes 18 are made directly above the silicon pillars 15 to reach the silicon pillars 15 of the lower selection transistors LST therebelow.

Then, the insulating film 20 including the charge storage layer 22 described above is formed on the side walls of the through-holes 18. Subsequently, the silicon pillars 19 are filled to obtain the structure illustrated in FIG. 6A. Accordingly, the memory cell is formed at the intersection of the silicon pillar 19 and each of the electrode layers WL.

Figure 6A:
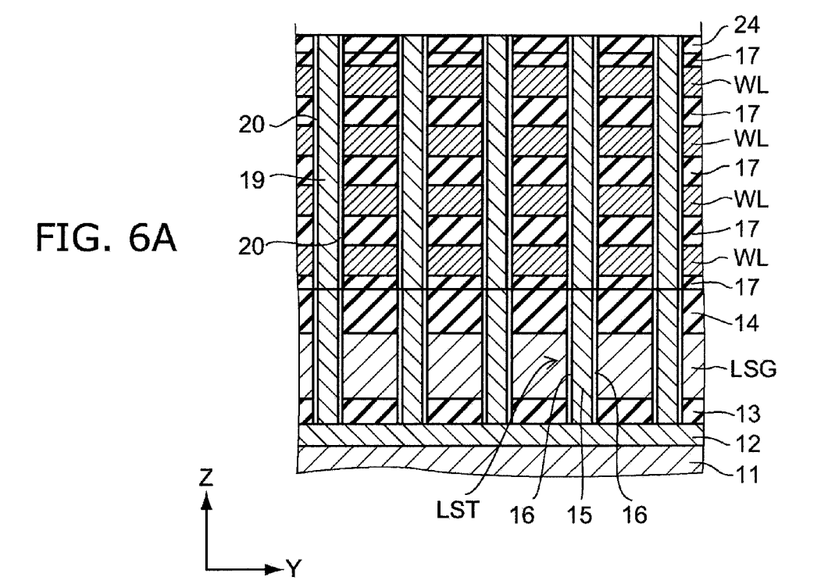
FIGS. 6A and 6B are schematic views of the process following FIG. 5.
Figure 6B:
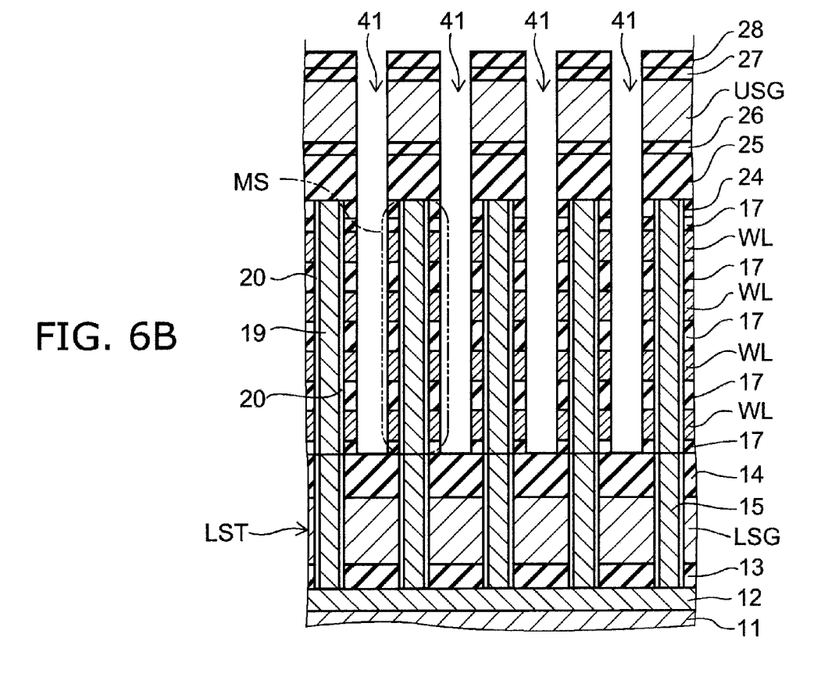

Continuing as illustrated in FIG. 6B, the insulating layer (e.g., a silicon nitride layer) 25, the insulating layer (e.g., a silicon oxide layer) 26, the silicon layer forming the upper selection gate USG, the insulating layer (e.g., a silicon oxide layer) 27, and the insulating layer (e.g., a silicon nitride layer) 28 are formed on the insulating layer 24. Then, trenches 41 are made to pass through the stacked unit thereof and the stacked unit including the electrode layers WL and the insulating layers 17 therebelow.

Patterning of the end portions of the electrode layers WL and the like into the stairstep configuration as illustrated in FIG. 1, filling an insulating layer to cover the stairstep configuration portion, etc., may be performed prior to making the trenches 41.

The trenches 41 are made by forming a not-illustrated resist pattern on the insulating layer 28, using the resist pattern as a mask, and performing RIE. The trenches 41 are made in portions proximal to the memory strings MS in slit configurations aligned in the X direction.

An enlarged proximity of one of the trenches 41 will be described with reference to FIG. 7 to FIG. 9.

Figure 7:
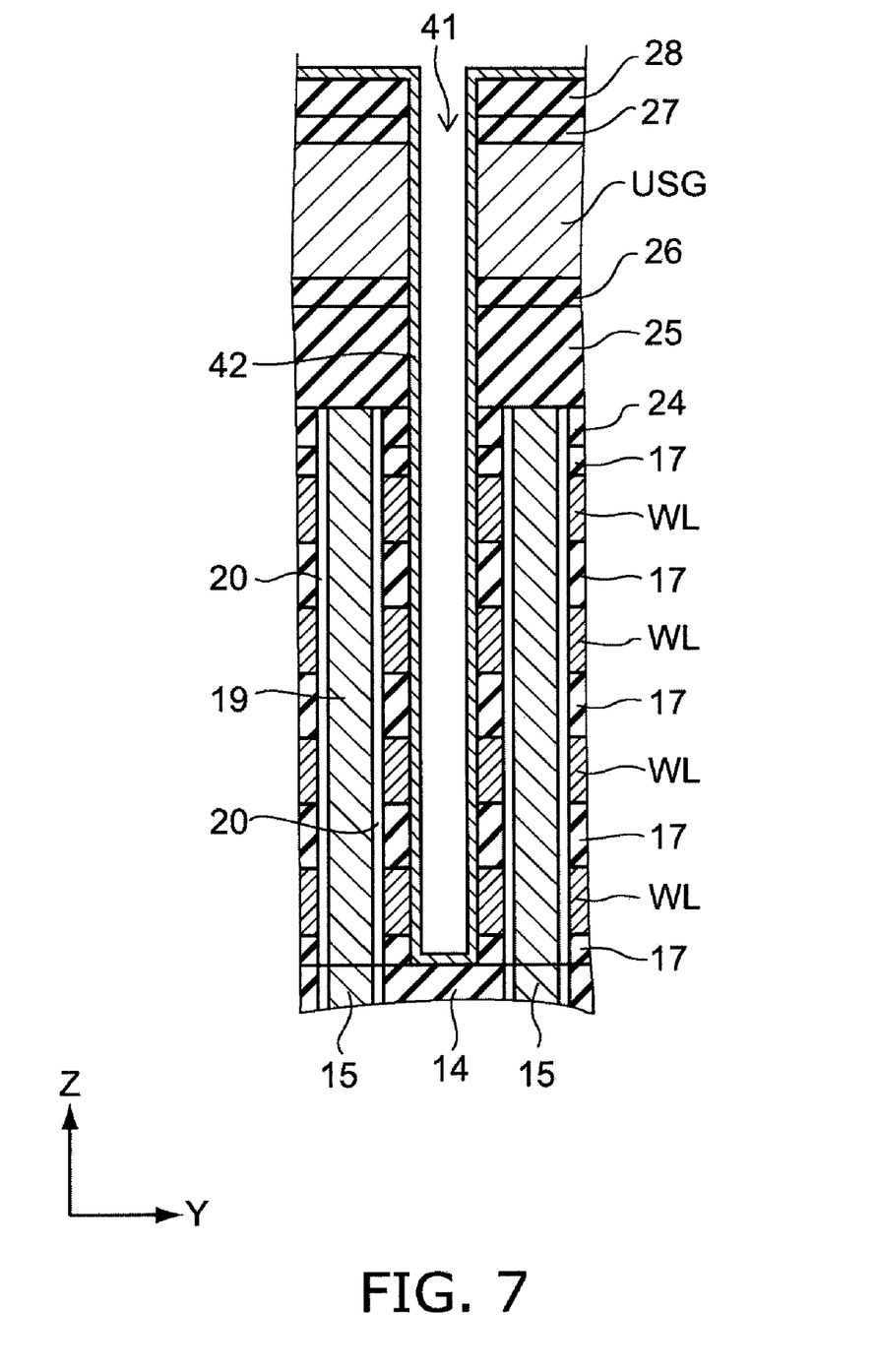
FIG. 7 is a schematic view of the process following FIG. 6.

After making the trench 41, the metal film 42 is formed on the side wall of the trench 41 as illustrated in FIG. 7. The metal film 42 is formed by, for example, CVD (chemical vapor deposition) and is formed on the bottom portion of the trench 41 and the surface of the insulating layer 28 in addition to the side wall of the trench 41. By covering the side wall of the trench 41, the metal film 42 contacts the upper selection gate USG and the electrode layers WL exposed at the side wall of the trench 41.

The metal film 42 includes a material capable of reacting with the silicon of the electrode layers WL and the upper selection gate USG to form a metal silicide, e.g., at least one of Co (cobalt), Ti (titanium), Ni (nickel), Pt (platinum), Pd (palladium), Er (erbium), and Ta (tantalum).

The formation of the metal film 42 is performed by CVD using relatively low temperature conditions such that metal siliciding with the electrode layers WL and the upper selection gate USG does not progress and the expansion of the metal silicide does not start.

Figure 8:
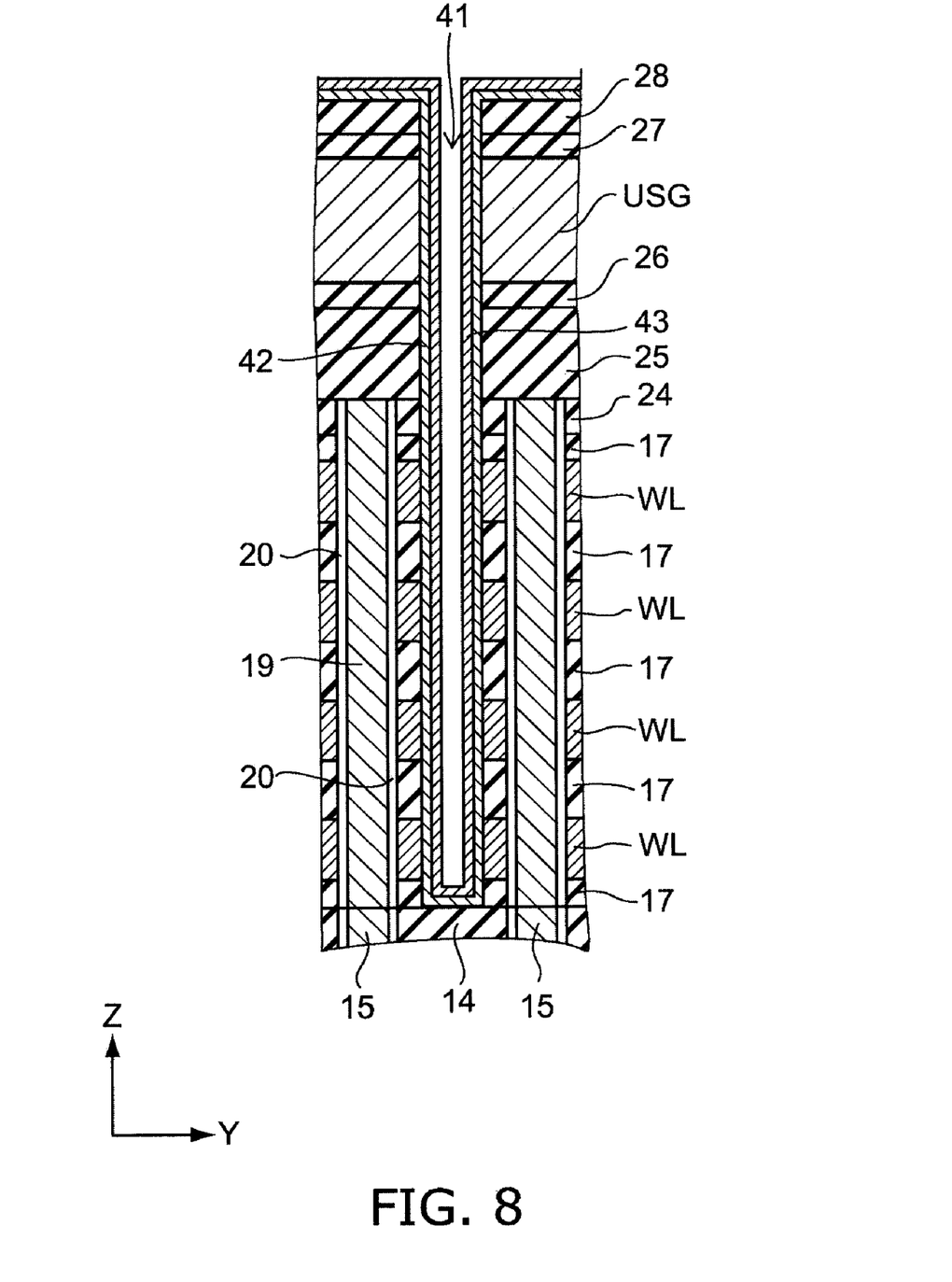
FIG. 8 is a schematic view of the process following FIG. 7.

After forming the metal film 42, a first cap film 43 is formed to cover the metal film 42 as illustrated in FIG. 8. The first cap film 43 is, for example, a TiN (titanium nitride) film. The formation of the first cap film 43 also is performed by CVD using relatively low temperature conditions such that metal siliciding of the metal film 42 with the electrode layers WL and the upper selection gate USG does not progress and the expansion of the metal silicide does not start.

Figure 9:
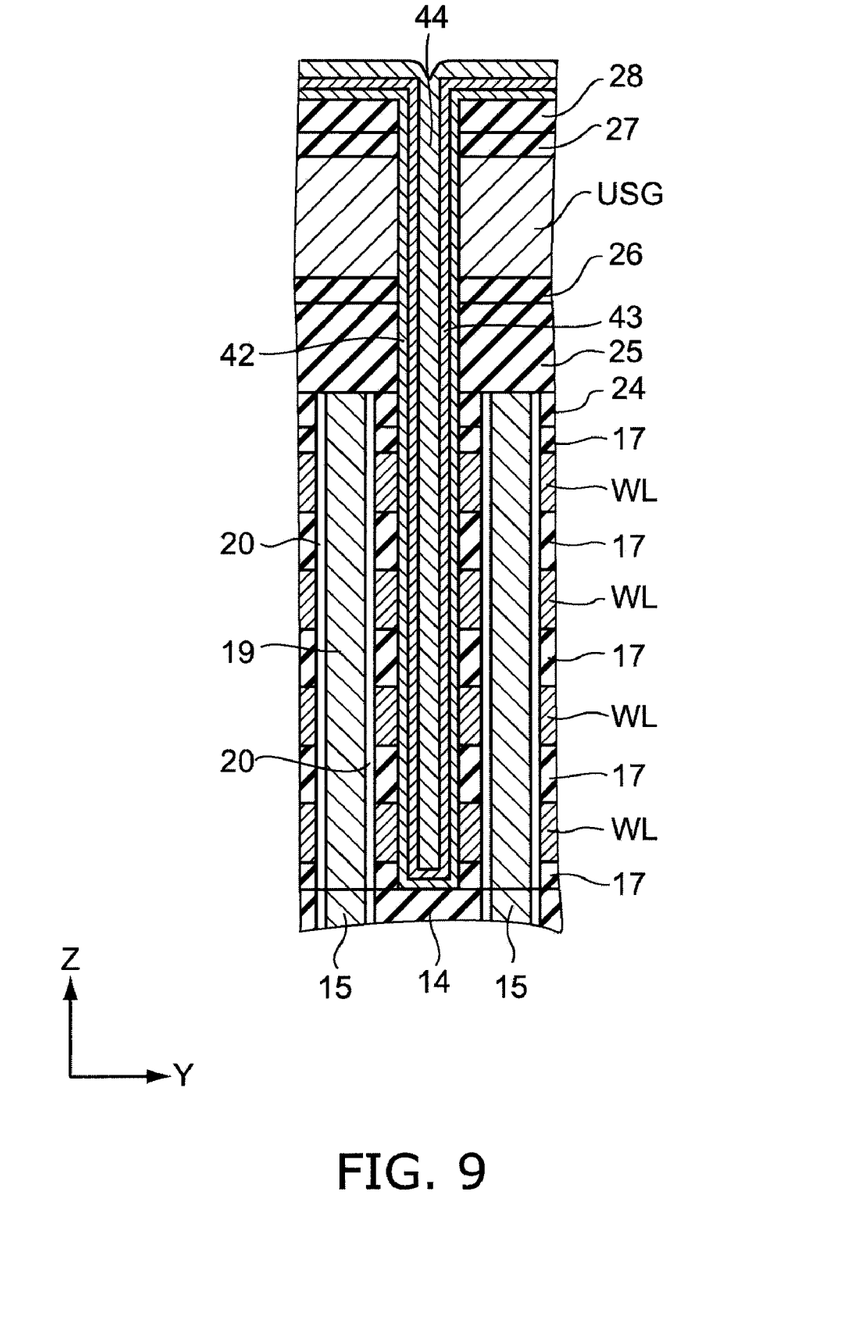
FIG. 9 is a schematic view of the process following FIG. 8.

After forming the first cap film 43, a second cap film 44 is filled into the trench 41 to cover the first cap film 43 as illustrated in FIG. 9.

The second cap film 44 is made of a different material than that of the first cap film 43. The material of the second cap film 44 has excellent fillability in the trench 41 at a relatively low temperature that does not accelerate metal siliciding and has sufficient hardness (a large Young's modulus) to suppress expansion of the metal silicide, e.g., a refractory metal such as W (tungsten), Ta (tantalum), and the like. The formation of the second cap film 44 also is performed by CVD using relatively low temperature conditions such that metal siliciding of the metal film 42 with the electrode layers WL and the upper selection gate USG does not progress and the expansion of the metal silicide does not start.

Although the metal film 42, the first cap film 43, and the second cap film 44 may be formed by sputtering, CVD provides excellent coverage of the side wall and is favorable particularly in the case where many electrode layers WL are used and the aspect ratio of the trench 41 is high.

The first cap film 43 functions as a barrier film to prevent the material of the second cap film 44 and the source material of the formation of the second cap film 44 from affecting the metal film 42, the electrode layers WL, and the upper selection gate USG. Thereby, a good silicide can be formed by the metal film 42 with the electrode layers WL and the upper selection gate USG without being affected by the cap films 43 and 44.

By providing the first cap film 43 which functions as a barrier film as described above, the material and the film formation process of the second cap film 44 can be selected without condition constraints considering effects on the electrode layers WL, the metal film 42, and the like. The material of the second cap film 44 can be selected considering only fillability in the trench 41, effective parameters for suppressing expansion of the metal silicide such as Young's modulus, and ease of removal in subsequent steps. The increased degrees of freedom of the selection are advantageous for cost reductions and improving manufacturing efficiency.

In the case where W (tungsten), for example, is used as the second cap film 44, it may be considered to use the tungsten film also as the metal film for metal siliciding by forming the tungsten film in contact with the electrode layers WL and/or the upper selection gate USG to form tungsten silicide. However, $WF_6$ is often used as the source material of the CVD of the tungsten film, and there is a risk that the Si (silicon) of the electrode layers WL and the upper selection gate USG may be depleted from the electrode layers WL and/or the upper selection gate USG to bond with F (fluorine) during the CVD film formation to form $SiF_4$, cause deterioration of the film qualities of the electrode layers WL and/or the upper selection gate USG, and result in characteristic fluctuations.

In the case where only the metal film for the metal siliciding is filled into the trench 41, it is difficult to control the desired metal penetration amount from the metal film into the electrode layers WL and the upper selection gate USG; excess metal may penetrate into the electrode layers WL and the upper selection gate USG; and there is a risk of characteristic fluctuations such as threshold fluctuation of the transistors using the electrode layers WL and the upper selection gate USG as the gate electrodes.

Conversely, in this embodiment, the film thickness of the metal film 42 for metal siliciding can easily be controlled by setting the conditions during the CVD film formation. Thereby, the desired metal penetration amount into the electrode layers WL and the upper selection gate USG can be controlled, and the transistors can easily be set to the desired characteristics.

After filling the first cap film 43 and the second cap film 44 into the trench 41, heat treatment (annealing) is performed in this state. The heat treatment accelerates the metal siliciding reaction at the portions where the metal film 42 is in contact with the electrode layers WL and the upper selection gate USG to form a metal silicide film at the portions where the metal film 42 opposes the electrode layers WL and the upper selection gate USG. Thereby, the resistance is reduced for the portions functioning as the gate electrodes of the upper selection transistor and the memory cells. A metal silicide film is substantially not formed at the portions where the metal film 42 contacts the insulating layers of silicon oxide, silicon nitride, and the like.

During the heat treatment recited above, the cap films 43 and 44 are filled into the trench 41 on the side of the face of the metal film 42 opposite to the face contacting the electrode layers WL and the upper selection gate USG. Therefore, pressure from the cap films 43 and 44 acts on the interface between the metal film 42 and the electrode layers WL and the upper selection gate USG to suppress the volume expansion of the metal silicide film. Suppressing the volume expansion of the metal silicide film also suppresses the expansion of the metal silicide film in the stacking direction of the electrode layers WL. As a result, shorts via the metal silicide film between the electrode layers WL above and below can be prevented.

After the metal siliciding by the heat treatment recited above, the second cap film 44 and the first cap film 43 are removed by, for example, wet etching. Further, the excess metal of the metal film 42 unreacted with the silicon similarly is removed by wet etching. Subsequently, as illustrated in FIG. 3, the dielectric substance (e.g., silicon oxide or silicon nitride) 51 is filled into the trench 41 from which the cap film 43, the cap film 44, and the unreacted metal are removed.

Then, as illustrated in FIG. 3, through-holes are made by RIE in the stacked unit including the upper selection gate USG to align in the stacking direction (the Z direction) thereof and reach the upper end of the silicon pillar 19 therebelow. Subsequently, the gate insulating film 33 is formed on the side walls of the through-holes, and the silicon pillars 32 are filled into the through-holes. Thereby, the upper selection transistors UST are formed. Thereafter, processing is continued to form leads such as the bit lines BL.

Figure 10:
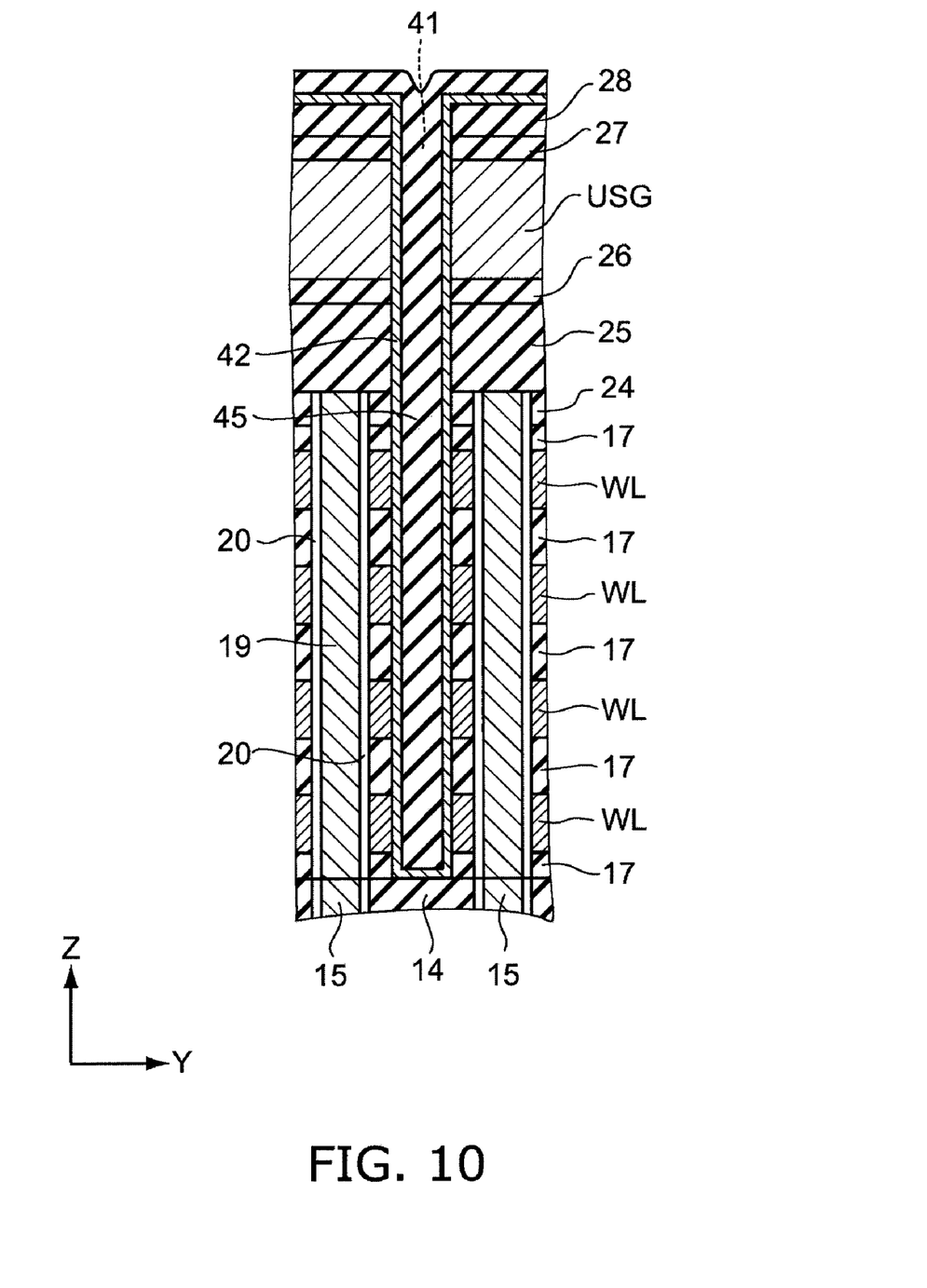
FIG. 10 is a schematic view of another manufacturing method of the semiconductor memory device according to the embodiment.

Next, FIG. 10 illustrates another method for manufacturing the semiconductor memory device according to an embodiment of the invention. FIG. 10 corresponds to the cross section of FIG. 9 of the embodiment described above.

In this embodiment, after the metal film 42 is formed in the trench 41, only one type of cap film 45 is filled into the trench 41 to cover the metal film 42. The cap film 45 is made of a material which is nonreactive with the silicon of the electrode layers WL, the silicon of the upper selection gate USG, and the metal film 42 and does not affect the metal siliciding of the metal film 42 with the electrode layers WL and the upper selection gate USG. From such aspects, a dielectric substance may be used. Among dielectric substances, TEOS (tetraethoxysilane) is desirable because of its relatively high Young's modulus of about 60 GPa and its hardness sufficient to suppress expansion of the metal silicide film.

Because only one type of film is used as the cap film in this embodiment, the number of steps is less than that of the case where two types of cap films are used, and costs can be reduced.

Figure 11:
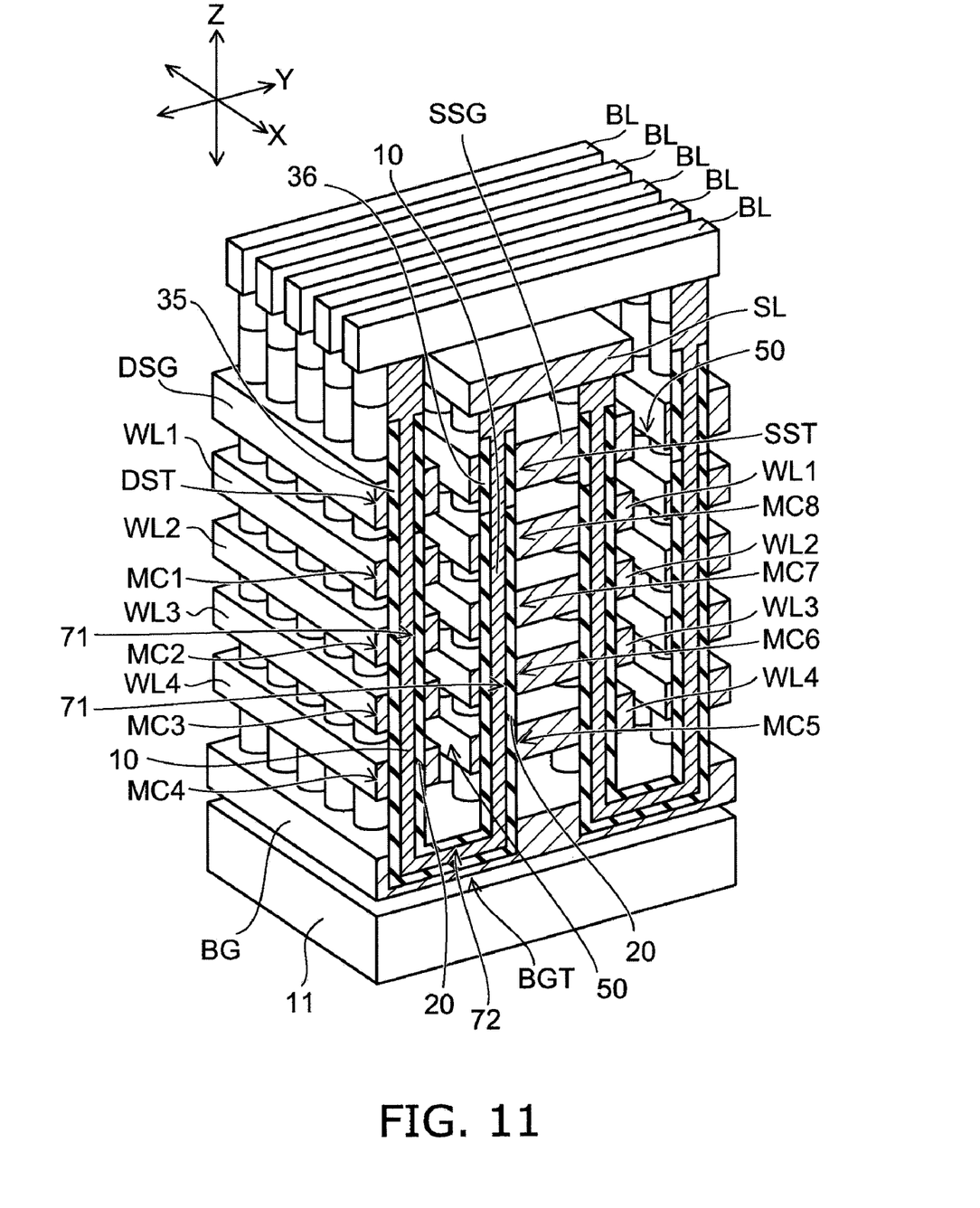
FIG. 11 is a schematic perspective view illustrating another specific example of the memory cell array of the semiconductor memory device according to the embodiment.

FIG. 11 is a schematic perspective view illustrating another specific example of the memory cell array of the semiconductor memory device according to an embodiment of the invention. For better clarity in FIG. 11, the insulative portions other than the insulating film 20 formed in a memory hole are omitted. In FIG. 11, an XYZ coordinate system is introduced similarly to that of FIG. 1. Multiple electrode layers WL1 to WL4 are stacked in the Z direction. Each of the bit lines BL is aligned in the Y direction.

A back gate BG is provided on the substrate 11 via a not-illustrated insulating layer. The back gate BG is, for example, a conductive silicon layer with an added impurity. The multiple electrode layers WL1 to WL4 are alternately stacked with not-illustrated insulating layers on the back gate BG. The number of layers of the electrode layers WL1 to WL4 is arbitrary; and FIG. 11 illustrates the case of, for example, four layers. The electrode layers WL1 to WL4 are, for example, conductive silicon layers with an added impurity.

The stacked unit including the electrode layers WL1 to WL4 on the back gate BG is divided into multiple blocks by trenches 50 aligned in the X direction. A drain side selection gate DSG is provided on the uppermost electrode layer WL1 of one block via a not-illustrated insulating layer. The drain side selection gate DSG is, for example, a conductive silicon layer with an added impurity. In another block adjacent to the one block, a source side selection gate SSG is provided on the uppermost electrode layer WL1 via a not-illustrated insulating layer. The source side selection gate SSG is, for example, a conductive silicon layer with an added impurity.

A source line SL is provided on the source side selection gate SSG via a not-illustrated insulating layer. The source line SL is, for example, a conductive silicon layer with an added impurity. Alternatively, a metal material may be used as the source line SL. Multiple bit lines BL are provided on the source line SL and the drain side selection gate DSG via a not-illustrated insulating layer.

U-shaped multiple memory holes are formed in the stacked unit on the substrate 11 described above. In the block including the drain side selection gate DSG, a memory hole is made aligned in the Z direction to pass through the drain side selection gate DSG and the electrode layers WL1 to WL4 therebelow. In the block including the source side selection gate SSG, a memory hole is made aligned in the Z direction to pass through the source side selection gate SSG and the electrode layers WL1 to WL4 therebelow. Both memory holes communicate with each other via a memory hole made in the back gate BG to align in the Y direction.

A silicon body 10 is provided as a U-shaped semiconductor layer in the interior of the memory holes. A gate insulating film 35 is formed on the inner wall of the memory hole between the drain side selection gate DSG and the silicon body 10. A gate insulating film 36 is formed on the inner wall of the memory hole between the source side selection gate SSG and the silicon body 10. An insulating film 20 is formed on the inner walls of the memory holes between the silicon body 10 and each of the electrode layers WL1 to WL4. The insulating film 20 also is formed on the inner wall of the memory hole between the back gate BG and the silicon body 10.

Similarly to the embodiment described above referring to FIG. 4, the insulating film 20 has an ONO (Oxide-Nitride-Oxide) structure in which the charge storage layer 22, i.e., a silicon nitride film, is disposed between the first insulating film 21, i.e., a silicon oxide film, and the second insulating film 23, i.e., a silicon oxide film.

The silicon body 10 functions as a channel. Each of the electrode layers WL1 to WL4 function as a control gate. The charge storage layer functions as a data memory layer that stores the charge injected by the silicon body 10. In other words, a memory cell having a structure of a control gate enclosing a channel is formed at the intersection between the silicon body 10 and each of the electrode layers WL1 to WL4.

A drain-side selection transistor DST is formed of the drain side selection gate DSG, the silicon body 10 passing through the drain side selection gate DSG, and the gate insulation film 35 provided between the drain side selection gate DSG and the silicon body 10. The upper end portion of the silicon body 10 protrudes above the drain side selection gate DSG and connects to the corresponding bit line BL.

A source-side selection transistor SST is formed of the source side selection gate SSG, the silicon body 10 passing through the source side selection gate SSG, and the gate insulating film 36 provided between the source side selection gate SSG and the silicon body 10. The upper end portion of the silicon body 10 protrudes above the source side selection gate SSG and connects to source line SL.

A back gate transistor BGT is formed of the back gate BG, the silicon body 10 provided in the back gate BG, and the insulating film 20 provided between the back gate BG and the silicon body 10.

Between the drain-side selection transistor DST and the back gate transistor BGT, there is provided a memory cell MC1 having the electrode layer WL1 as a control gate, a memory cell MC2 having the electrode layer WL2 as a control gate, a memory cell MC3 having the electrode layer WL3 as a control gate, and a memory cell MC4 having the electrode layer WL4 as a control gate.

Between the back gate transistor BGT and the source-side selection transistor SST, there is provided a memory cell MC5 having the electrode layer WL4 as a control gate, a memory cell MC6 having the electrode layer WL3 as a control gate, a memory cell MC7 having the electrode layer WL2 as a control gate, and a memory cell MC8 having the electrode layer WL1 as a control gate.

The drain-side selection transistor DST, the memory cells MC1 to MC4, the back gate transistor BGT, the memory cells MC5 to MC8, and the source-side selection transistor SST are connected in series to form one memory string. The one memory string is formed in a U-shape including a pair of columnar portions 71 aligned in the Z direction and a linking portion 72 communicating between the lower end portions of the columnar portions 71. By multiply arranging such memory strings in the X direction and the Y direction, the multiple memory cells MC1 to MC8 are three dimensionally provided in the X direction, the Y direction, and the Z direction.

The drain side selection gate DSG, the source side selection gate SSG, and the electrode layers WL1 to WL4 are silicon layers with resistance reduced by metal siliciding of the portions thereof adjacent to the trench 50. The process for performing the metal siliciding may be similar to that of the embodiment described above.

First, the trench 50 is made in the stacked unit including the silicon layers of the electrode layers WL1 to WL4 and the drain side selection gate DSG or the source side selection gate SSG thereabove. The trench 50 is made between the pair of columnar portions 71 of the U-shape memory string.

After making the trench 50, a metal film is formed on the side walls of the trench 50. After forming the metal film, the cap film is filled into the trench 50. For example, similarly to the embodiment described above, the metal film is covered by the first cap film (the titanium nitride film). Then, the second cap film of tungsten, tantalum, and the like is filled into the trench 50. Alternatively, as in the embodiment illustrated in FIG. 10, a dielectric substance may be filled into the trench 50 as the cap film.

Heat treatment is performed in the state where the cap film is filled into the trench 50, and metal siliciding is performed on the portions of the silicon layers (the drain side selection gate DSG, the source side selection gate SSG, and the electrode layers WL1 to WL4) opposing the metal film.

In this embodiment as well, during the heat treatment, the cap film is filled into the trench 50. Therefore, pressure from the cap film acts on the interface between the metal film and the silicon layers (the drain side selection gate DSG, the source side selection gate SSG, and the electrode layers WL1 to WL4) to suppress the volume expansion of the metal silicided portions. As a result, shorts via the metal silicide between the silicon layers above and below can be prevented.

Thereafter, the cap film and the unreacted excess metal of the silicon are removed; and a dielectric substance such as, for example, silicon oxide, silicon nitride, and the like is filled into the trench 50.

Hereinabove, exemplary embodiments of the invention are described with reference to specific examples. However, the invention is not limited thereto, and various modifications are possible based on the technical spirit of the invention.

The silicon pillars are not limited to circular columnar configurations, and may be prismatic. Alternatively, the interior of the through-hole is not limited to being entirely filled by columnar silicon; and a structure may be used in which a silicon film is formed in a cylindrical configuration only on portions contacting the insulating film including the charge storage layer and an insulator is filled along the inner side thereof. The insulating film structure between the electrode layers and the silicon is not limited to an ONO (Oxide-Nitride-Oxide) structure, and may be, for example, a two-layer structure of a charge storage layer and a gate insulating film.

The invention claimed is:

1. A method for manufacturing a semiconductor memory device, comprising:
    forming a stacked unit above a semiconductor substrate, the stacked unit including a plurality of insulating layers alternately stacked with a plurality of electrode layers, the electrode layers being formed of a semiconductor;
    making a hole in the stacked unit to pass through the electrode layers and the insulating layers;
    forming an insulating film on a side wall of the hole, the insulating film including a charge storage layer;
    forming a semiconductor layer in an interior of the hole to align in a stacking direction of the electrode layers and the insulating layers to form a memory string by multiply connecting memory cells in the stacking direction, the memory cell including the electrode layer, the charge storage layer opposing the electrode layer, and the semiconductor layer opposing the charge storage layer;
    making a trench in a portion of the stacked unit proximal to the memory string to pass through the electrode layers and the insulating layers;
    forming a metal film on a side wall of the trench;
    forming a cap film to cover the metal film and fill into the trench;
    performing heat treatment in the state where the cap film is filled into the trench to cause the metal film to react with the semiconductor of the electrode layers and form a compound between the semiconductor and the metal film at portions of the electrode layers contacting the metal film;
    removing the cap film and an unreacted excess portion of the metal film; and
    providing a dielectric substance in the trench after the cap film and the unreacted excess portion are removed.

2. The method according to claim 1, wherein the metal film is formed at a temperature where a reaction between the semiconductor of the electrode layers and the metal film does not progress.

3. The method according to claim 1, wherein the metal film is formed by CVD (chemical vapor deposition).

4. The method according to claim 1, wherein the cap film is formed at a temperature where a reaction between the semiconductor of the electrode layers and the metal film does not progress.

5. The method according to claim 1, wherein the cap film is formed by CVD (chemical vapor deposition).

6. The method according to claim 1, wherein
    the cap film includes a first cap film and a second cap film having mutually different types,
    the first cap film covering a surface of the metal film, the second cap film covering a surface of the first cap film to fill into the trench.

7. The method according to claim 6, wherein the first cap film functions as a barrier film to prevent a material of the second cap film and a source material of the formation of the second cap film from affecting a reaction between the metal film and the electrode layers.

8. The method according to claim 7, wherein the first cap film includes titanium nitride.

9. The method according to claim 6, wherein the second cap film includes tungsten.

10. The method according to claim 6, wherein the second cap film includes tantalum.

11. The method according to claim 1, wherein the cap film is made of one type of film nonreactive with the semiconductor of the electrode layers.

12. The method according to claim 11, wherein the cap film is nonreactive with the metal film.

13. The method according to claim 12, wherein the cap film includes an insulator.

14. The method according to claim 13, wherein the cap film includes TEOS (tetraethoxysilane).

15. The method according to claim 1, wherein the electrode layers include silicon and the metal film includes a material capable of reacting with the silicon to form a metal silicide.

16. The method according to claim 1, wherein
    the metal film is formed also on portions of the insulating layers exposed inside the trench, and
    the insulating layers do not react with the metal film during the heat treatment.

17. The method according to claim 1, wherein the cap film and the unreacted excess portion of the metal film are removed by wet etching.

18. The method according to claim 1, further comprising:
    forming a selection gate of a selection gate transistor above the stacked unit,
    the trench being made also to pass through the selection gate,
    the metal film being formed also on a side wall of the trench where the selection gate is exposed,
    the heat treatment being performed in the state where the cap film is filled into the trench to form a compound also between the selection gate and the metal film at a portion of the selection gate contacting the metal film.

19. The method according to claim 1, wherein
    the memory string includes a pair of columnar portions aligned in the stacking direction and a linking portion communicating with lower end portions of the pair of columnar portions, and
    the trench is made between the pair of columnar portions.

20. The method according to claim 1, wherein
    the forming the insulating film including the charge storage layer includes forming a first insulating film on the side wall of the hole, forming the charge storage layer on an inner side of the first insulating film, and forming a second insulating film on an inner side of the charge storage layer, and
    the semiconductor layer is formed on an inner side of the second insulating film.

* * * * *